United States Patent [19]
Kohno

[11] Patent Number: 5,888,860
[45] Date of Patent: Mar. 30, 1999

[54] METHOD OF MAKING FIELD EFFECT TRANSISTOR

[75] Inventor: Yasutaka Kohno, deceased, late of Saijyo, Japan, by Yoko Kohno, heir/legal representative of the remaining minor heir.

[73] Assignee: Mitsubishi Denki Kabushiki Kaisha, Tokyo, Japan

[21] Appl. No.: 650,032

[22] Filed: May 17, 1996

Related U.S. Application Data

[63] Continuation of Ser. No. 386,465, Feb. 10, 1995, abandoned.

[30] Foreign Application Priority Data

Feb. 18, 1994 [JP] Japan .................................. 6-020847

[51] Int. Cl.$^6$ ........................... H01L 21/338; H01L 21/28
[52] U.S. Cl. ........................... 438/180; 438/172; 438/184; 438/579; 438/606
[58] Field of Search ..................... 257/284, 285; 438/180, 182, 184, 167, 590, 605, 606, 576, 579, 577, 573, 574, 595, 172, 737, 738, 739, 740

[56] References Cited

U.S. PATENT DOCUMENTS

| | | | |
|---|---|---|---|
| 4,774,206 | 9/1988 | Willer | 438/577 |
| 4,889,827 | 12/1989 | Willer | 148/DIG. 139 |
| 5,140,386 | 8/1992 | Huang et al. | 357/22 |
| 5,231,040 | 7/1993 | Shimura | 438/180 |
| 5,262,660 | 11/1993 | Streit et al. | 257/194 |
| 5,389,574 | 2/1995 | Nizunuma | 438/172 |
| 5,409,849 | 4/1995 | Kishita et al. | 438/180 |
| 5,514,605 | 5/1996 | Asai et al. | 438/172 |

FOREIGN PATENT DOCUMENTS

| | | |
|---|---|---|
| 303248 | 8/1988 | European Pat. Off. . |
| 439114 | 1/1991 | European Pat. Off. . |
| 614230 | 3/1994 | European Pat. Off. . |
| 0308939 | 3/1989 | Germany . |
| 1251664 | 10/1989 | Japan . |
| 3-60162 | 3/1991 | Japan . |
| 355851 | 3/1991 | Japan . |
| 449626 | 2/1992 | Japan . |

OTHER PUBLICATIONS

SZE et al, *Semiconductor Devices . . .* , p. 268, 1986.
"Self–Aligned Recessed Gate MESFET", IBM Technical Disclosure Bulletin, vol. 28, No. 3, Aug. 1985, p. 916.
Takahashi et al, "C–Band Step–Doped Channel Structure Power GaAs MESFETs", Electronic Information and Communication Society, 1993, pp. 5–89.
Takahashi et al, "Step–Recessed Gate GaAs FETs With An Undoped Surface Layer", IEDM 91–259, pp. 9.8.1–9.8.4.
Cooper et al, "8–Watt High Efficiency X–Band Power Amplifier Using AlGaAs/GaAs HFet Technology", IEEE, GaAs IC Symposium, 1992, pp. 183–185.

*Primary Examiner*—Michael Trinh
*Attorney, Agent, or Firm*—Leydig, Voit & Mayer

[57] ABSTRACT

A method of fabricating an FET includes forming an active layer including a low dopant concentration layer, forming a recess in the active layer so that the bottom of the recess is present within the low dopant concentration semiconductor layer, forming side walls in the recess, and forming a gate electrode in the recess using the side walls as masks. The gate length can be precisely reduced by the side walls. Further, even when the active layer is anisotropically etched to form the side walls, the low dopant concentration semiconductor layer is subjected to the etching. Therefore, a part of the active layer where a greater part of channel current flows is not adversely affected by the etching. Therefore, any variation in the thickness of the active layer does not vary the channel current of the transistor.

5 Claims, 7 Drawing Sheets

Prior Art

METHOD OF MAKING FIELD EFFECT TRANSISTOR

This disclosure is a division of patent application Ser. No. 08/386,465, filed Feb. 10, 1995, now abandoned.

FIELD OF THE INVENTION

The present invention relates to a field effect transistor in which a gate electrode is disposed in a recess in an active layer and a method of fabricating field effect transistor.

BACKGROUND OF THE INVENTION

FIGS. 7(a)–7(i) are sectional views illustrating process steps in a prior art method of fabricating a field effect transistor (hereinafter referred to as an FET).

Figure 7:
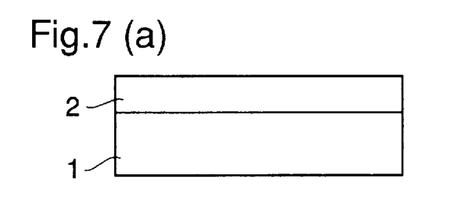
FIGS. 7(a)–7(i) are sectional views illustrating process steps in a method of fabricating an FET according to the prior art.

Initially, as illustrated in FIG. 7(a), an n type GaAs layer 2 having a dopant concentration of $3\times10^{17}$ $cm^{-3}$ and a thickness of 3000 Å is grown on a semi-insulating GaAs substrate 1 by molecular beam epitaxy (hereinafter referred to as MBE). Thereafter, as illustrated in FIG. 7(b), an $SiO_2$ film 3 having a thickness of about 3000 Å is deposited over the n type GaAs layer 2 by plasma chemical vapor deposition (hereinafter referred to as plasma CVD).

In the step of FIG. 7(c), a resist pattern 4 with an opening 4a having a prescribed width is formed on the n type GaAs layer 2 by conventional photolithographic techniques.

Using the resist pattern 4 as a mask, the $SiO_2$ film 3 is subjected to reactive ion etching with a gas mixture of $CHF_3$ and $O_2$ through the opening 4a, forming an opening 3a in the $SiO_2$ film 3, followed by removal of the resist pattern 4 (FIG. 7(d)).

In the step of FIG. 7(e), using the $SiO_2$ film 3 as a mask, the n type GaAs layer 2 exposed in the opening 3a is subjected to dry etching to remove a prescribed portion of the GaAs layer 2, thereby forming a recess 2a. Thereafter, an $SiO_2$ film 5 about 5000 Å thick is deposited on the $SiO_2$ film 3 and in the recess 2a.

In the step of FIG. 7(f), the $SiO_2$ film 5 is subjected to reactive ion etching with a gas mixture of $CHF_3$ and $O_2$. Since the etching proceeds anisotropically in a direction perpendicular to the surface of the n type GaAs layer 2, portions 5a of the $SiO_2$ film 5 are left on the opposite side surfaces of the recess 2a. These portions 5a are called side walls hereinafter.

Thereafter, a WSi film 6 and an Au film 7 are successively sputtered on the $SiO_2$ film 3, on the side walls 5a, and on the bottom of the recess 2a (FIG. 7(g)), and the Au film 7 and the WSi film 6 are patterned by ion milling and reactive ion etching, respectively, resulting in a gate electrode 8 as shown in FIG. 7(h).

After removal of the $SiO_2$ film 3 and the side walls 5a with an aqueous buffered HF (BHF) solution, source and drain electrodes 9a and 9b comprising an ohmic metal are formed on the GaAs layer 2 at the opposite sides of the gate electrode 8 to complete an FET 100 shown in FIG. 7(i).

In the prior art method of fabricating an FET, the side walls 5a are formed on the opposite side surfaces of the recess 2a, and the gate electrode 8 is formed on a part of the bottom of the recess between the side walls 5a. In this process, a gate electrode having an accurately reduced gate length is formed in the recess 2a with high reliability. More specifically, since the width of the side wall 5a depends on the thickness of the $SiO_2$ film 5, the width of the side wall 5a can be varied by verifying the thickness of the $SiO_2$ film 5. Therefore, an opening region having a width equal to a desired gate length of the gate electrode 8 is formed at the bottom of the recess 2 with high accuracy.

However, in order to reduce the gate length with high accuracy, both accurate control of the thickness of the $SiO_2$ film 5 in the step of FIG. 7(e) and strong anisotropy of the reaction ion etching of the $SiO_2$ film in the step of FIG. 7(f) are required. In this reactive ion etching, if the applied RF voltage is increased and the pressure of the etching gas is reduced to increase the anisotropy of the etching, the etching selectivity between the n type GaAs layer 2 and the $SiO_2$ film 5 is reduced, so that not only the $SiO_2$ film 5 but also the n type GaAs layer 2 are etched as shown by a dotted circle A in FIG. 7(f). In this case, the thickness of the n type GaAs active layer 2 beneath the gate electrode is varied in a completed transistor, resulting in variations in the operating characteristics. To be specific, in the above-described n type GaAs active layer 2 having a dopant concentration of $3\times10^{17}$ $cm^{-3}$, when the active layer 2 is excessively etched by 13 Å in the direction perpendicular to the surface of the active layer 2, the current of the transistor varies by about 1 mA per gate width of unit 100 μm. This variation can be reduced to some extent by reducing the dopant concentration of the active layer. That is, when the dopant concentration of the active layer is reduced, current flowing per unit thickness is reduced, whereby the variation in the current to the variation in the thickness of the active layer is reduced. However, when the dopant concentration of the active layer is reduced, the transconductance of the transistor is degraded, and the gain during RF operation of the transistor is reduced.

Generally, in an FET, the gate breakdown voltage that has a considerable influence on the output characteristics increases with an increase in the distance between an edge of a gate electrode and an edge of a gate recess (hereinafter referred to as a gate edge to recess edge distance). Therefore, also in the prior art method shown in FIGS. 7(a)–7(i), the gate edge to recess edge distance can be increased by increasing the width of the recess 2a. However, in order to increase the gate edge to recess edge distance in the prior art method, both the width of the recess 2a and the width of the side wall 5a must be increased. Since the width of the side wall 5a depends on the thickness of the $SiO_2$ film 5, the thickness of the $SiO_2$ film 5 must be increased to increase the width of the side wall 5a. Then, the etching precision in the etching of the $SiO_2$ film 5 (FIG. 7(f)) is lowered, resulting in a variation in the gate length and an increase in the etching time.

It is well known that the gate breakdown voltage increases with a reduction in the dopant impurity concentration at the interface between the active layer and the gate electrode. In a prior art method, however, the increase in the gate breakdown voltage is achieved by inserting a low dopant concentration layer in an active layer and forming a gate electrode contacting the low dopant concentration layer. In this case, the low dopant concentration layer is present in the active layer at portions beneath source and drain electrodes, so that the gate-to-source resistance increases.

SUMMARY OF THE INVENTION

It is an object of the present invention to provide a method of fabricating an FET including forming side walls in a recess in an active layer and producing a gate electrode using the side walls as masks, which method provides an FET having less variation in operating characteristics with high reproducibility.

It is another object of the present invention to provide a method of fabricating an FET including forming side walls in a recess of an active layer and producing a gate electrode using the side walls as masks, in which the gate edge to recess edge distance can be increased to increase the gate breakdown voltage without increasing the thickness of an insulating film that is patterned to form the side walls, whereby the gate edge to recess edge distance can be increased with no variation in the gate length and no increase in the time required for the fabrication.

It is still another object of the present invention to provide an FET with reduced gate-to-source resistance and increased gate breakdown voltage.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a method of fabricating an FET, an active layer including a low dopant concentration layer is formed, a recess is formed in the active layer so that the bottom of the recess is present within the low dopant concentration semiconductor layer, side walls are formed in the recess, and a gate electrode is formed in the recess using the side walls as masks. Therefore, the gate length can be precisely reduced by the side walls. Further, even when the active layer is etched by anisotropic etching for forming the side walls, the low dopant concentration semiconductor layer is subjected to the etching, so that a part of the active layer other than the low dopant concentration semiconductor layer, wherein a greater part of channel current flows, is not adversely affected by the etching. Therefore, variation in the thickness of the active layer does not vary the channel current of the transistor.

According to a second aspect of the present invention, in a method of fabricating an FET, an active layer comprising a first semiconductor layer having a first composition and a thin second semiconductor layer having a second composition and inserted in the first semiconductor layer is formed on a substrate, a recess is formed in the active layer so that the bottom of the recess does not reach the thin second semiconductor layer, side walls are formed in the recess, a portion of the first semiconductor layer beneath the recess is selectively etched away by anisotropic etching using the side walls as masks and the second semiconductor layer as an etch stopping layer to expose the second semiconductor layer at a part of the bottom of the recess, and a gate electrode is formed in the recess using the side walls as masks so that it contacts the second semiconductor layer at the bottom of the recess. Therefore, the gate length can be precisely reduced by the side walls. In addition, the thickness of the active layer beneath the gate electrode is always the total of the thicknesses of the second semiconductor layer and a part of the first semiconductor layer under the second semiconductor layer, so that FETs with uniform operating characteristics are fabricated with high reproducibility. In addition, since a buried gate structure is produced, unwanted expansion of a surface depletion layer during RF operation is suppressed, and degradation in output characteristics during RF operation is reduced.

According to a third aspect of the present invention, in the above-described method of fabricating an FET, a low dopant concentration semiconductor layer is formed on the second semiconductor layer in the active layer, and the recess is formed so that the bottom is within the low dopant concentration layer. Therefore, the low dopant concentration layer is present at the surface of the active layer on opposite sides of the gate electrode, whereby unwanted expansion of a surface depletion layer during RF operation is suppressed and degradation in output characteristics during RF operation is reduced.

According to a fourth aspect of the present invention, in a method of fabricating an FET, an active layer comprising a first semiconductor layer having a first composition and a thin second semiconductor layer having a second composition and inserted in the first semiconductor layer is formed on a substrate, an insulating film is formed on the active layer and a prescribed portion of the insulating film is removed to form an opening. A recess is formed by selectively etching the active layer using the insulating film as a mask and the second semiconductor layer as an etch stopping layer so that the second semiconductor layer is exposed at the bottom of the recess and opposite ends of the recess extend beneath the insulating film. Side walls are formed in the recess, and a gate electrode is formed in the recess using the side walls as masks. In this method, a recess wider than the opening of the insulating etching mask is produced by controlling the time required for the recess etching. Therefore, in contrast to the prior art method, it is not necessary to increase the thickness of the insulating film of the side walls when the recess width is increased to increase the gate edge to recess edge distance. Consequently, an unwanted increase in the etching time for the insulating film and variation in the side wall width as in the prior art method are avoided.

According to a fifth aspect of the present invention, in a method of fabricating an FET, an active layer is formed on a substrate, which active layer comprises a first semiconductor layer having a first composition, a thin second semiconductor layer having a second composition and disposed at a first position within the first semiconductor layer, and a thin third semiconductor layer having the second composition and disposed at a second position within the first semiconductor layer, the second position being higher than the first position by a prescribed distance, wherein a portion of the first semiconductor layer between the second and third semiconductor layers has a low dopant concentration. Thereafter, an insulating film is formed on the active layer and a prescribed portion of the insulating film is removed to form an opening, a recess is formed by selectively etching the active layer using the insulating film as a mask and the third semiconductor layer as an etch stopping layer so that the third semiconductor layer is exposed at the bottom of the recess and opposite ends of the recess extend beneath the insulating film. Side walls are formed in the opening of the insulating film and in the recess, the third semiconductor layer and the first semiconductor layer are selectively etched by anisotropic etching with the insulating film and the side walls as masks and the second semiconductor layer as an etch stopping layer to expose the second semiconductor layer at a part of the bottom of the recess, and a gate electrode is formed in the recess using the side walls as masks so that the gate electrode contacts the second semiconductor layer. Therefore, as described above, when the recess width is increased to increase the gate edge to recess edge distance, an unwanted increase in the etching time for the insulating film and variation in the side wall width are avoided. Further, the low dopant concentration layer is present at the surface of the active layer on the opposite sides of the gate electrode, and a portion of the gate electrode is buried in the low dopant concentration layer. Therefore, in the completed FET, unwanted expansion of a surface depletion layer during RF operation is suppressed and degradation in output characteristics during the RF operation is reduced.

According to a sixth aspect of the present invention, in a method of fabricating an FET, a recess is formed in an active layer, a low dopant concentration semiconductor layer is selectively formed on an inner surface of the recess to form a gate recess having an inner surface of the semiconductor layer, and a gate electrode is formed in the gate recess. Therefore, the low dopant concentration layer is not present in a region of the active layer beneath the source and drain electrodes, and the gate electrode is formed on the low dopant concentration layer. Therefore, the gate breakdown voltage of the completed FET is increased with no increase in the gate-to-source resistance.

According to a seventh aspect of the present invention, in the above-described method of fabricating an FET, the low dopant concentration semiconductor layer has a composition different from the composition of the active layer and a band gap energy larger than the band gap energy of the active layer. Therefore, the gate breakdown voltage of the FET is further increased.

According to an eighth embodiment of the present invention, in a method of fabricating an FET, an active layer comprising a first semiconductor layer having a first composition and a thin second semiconductor layer having a second composition and disposed within the first semiconductor layer is formed on a substrate, a prescribed portion of the active layer is selectively etched away using the second semiconductor layer as an etch stopping layer to form a first recess in which the second semiconductor layer is exposed at the bottom, a low dopant concentration semiconductor layer having the first composition is selectively formed on the inner surface of the first recess to form a second recess having an inner surface of the low dopant concentration semiconductor layer, side walls are formed in the second recess, the low dopant concentration semiconductor layer is selectively etched away by anisotropic etching using the side walls as masks and the second semiconductor layer as an etch stopping layer to expose the second semiconductor layer at a part of the bottom of the second recess. A gate electrode is formed in the second recess using the side walls as masks so that it contacts the second semiconductor layer. Therefore, the low dopant concentration layer is not present in a region of the active layer beneath the source and drain electrodes, and a gate electrode with a precisely reduced gate length is buried in the low dopant concentration layer. Further, the thickness of the active layer beneath the gate electrode is always the total of the thicknesses of the second semiconductor layer and a part of the first semiconductor layer under the second semiconductor layer. Therefore, in the completed FET, the gate breakdown voltage is increased with no increase in the gate-to-source resistance, and the output characteristics during RF operation are not degraded. As a result, FETs with uniform operating characteristics are fabricated with high reproducibility.

DETAILED DESCRIPTION OF THE PREFERRED EMBODIMENTS

Embodiment 1.

FIGS. 1(a)–1(e) are sectional views illustrating process steps in a method of fabricating an FET according to a first embodiment of the present invention. In the figures, the same reference numerals as in FIGS. 7(a)–7(i) designate the same or corresponding parts. Reference numeral 20 designates an n type GaAs layer, numeral 21 designates an n⁻ type GaAs layer, numeral 22 designates an n⁺ type GaAs layer, and numeral 200 designates an FET.

Figure 1:
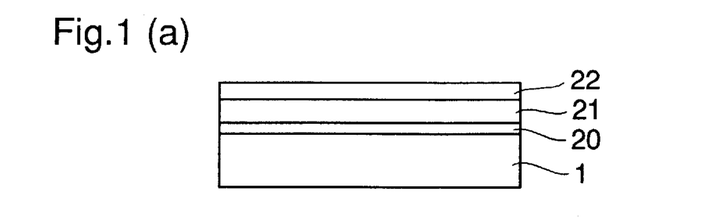
FIGS. 1(a)–1(e) are sectional views illustrating process steps in a method of fabricating an FET in accordance with a first embodiment of the present invention.

First of all, as illustrated in FIG. 1(a), there are successively grown on a semi-insulating GaAs substrate 1 an n type GaAs layer 20 having a dopant concentration of $6\times10^{17}$ cm$^{-3}$ and a thickness of 500 Å, an n⁻ type GaAs layer 21 having a dopant concentration of $5\times10^{16}$ cm$^{-3}$ and a thickness of 1500 Å, and an n⁺ type GaAs layer 22 having a dopant concentration of $2\times10^{18}$ cm$^{-3}$ and a thickness of 1000 ÅA. Preferably, these layers are grown by MBE.

In the step of FIG. 1(b), an SiO₂ film 3 about 3000 Å thick is deposited on the n⁺ type GaAs layer 22 by plasma CVD, and a prescribed portion of the SiO₂ film 3 is selectively removed by reactive ion etching in the same process as already described with respect to FIGS. 7(c) and 7(d), thereby forming an opening 3a.

Using the SiO₂ film 3 as a mask, the n⁺ type GaAs layer 22 exposed in the opening 3a is subjected to anisotropic dry etching to remove a portion of that layer 22. Subsequently, by the anisotropic dry etching, the n⁻ type GaAs layer 21 is etched to a prescribed depth from the surface, thereby forming a recess 2a. Thereafter, as in the prior art method, an SiO₂ film 5 about 5000 Å thick is deposited on the SiO₂ film 3 and in the recess 2a by plasma CVD (FIG. 1(c)). The thickness of a portion of the n⁻ type GaAs layer 21 left beneath the recess 2a must be larger than 500 Å so that a channel is produced in the n type GaAs layer 20 and the n⁻ type GaAs layer 21.

In the step of FIG. 1(d), side walls 5a are formed in the recess 2a in the same process as described with respect to FIGS. 7(f) and 7(e), followed by formation of a gate electrode 8 in the same process as described with respect to FIGS. 7(g) and 7(h). To complete the FET 200 shown in FIG. 1(e), source and drain electrodes 9a and 9b are formed on the n⁺ type GaAs layer 22 at the opposite sides of the gate electrode 8.

In the FET 200, a greater part of channel current flows in the n type GaAs layer 20, and the channel current is determined by the dopant concentration of the n type GaAs layer 20.

In the above-described fabrication method, the n⁺ GaAs layer 22 is employed to make the source and drain electrodes 9a and 9b ohmic electrodes.

In the above-described fabrication method of an FET according to the first embodiment of the invention, the recess 2a is formed so that the bottom is positioned within the n⁻ type GaAs layer 21, the side walls 5a are formed in this recess 2a, and the gate electrode 8 is formed using the side walls 5a as masks. Therefore, even when the n⁻ type GaAs layer 21 exposed at the bottom of the recess 2a is partially etched and the thickness of the n⁻ GaAs layer 21 is reduced at that part when the side walls 5a are formed, since a greater part of channel current flows through the n type GaAs layer 20 in the completed FET 200, the channel current does not significantly vary. Therefore, FETs with less variation in the operating characteristics are fabricated with high reproducibility and improved production yield as compared to the prior art method.

In the FET 200 fabricated by the method of this embodiment, since the channel current depends on the n type GaAs layer 20, a high transconductance is maintained during RF operation, so that the gain is not lowered. Further, since the n⁻ GaAs layer 21 is present at the interface between the active layer and the gate electrode 8, the gate breakdown voltage is increased and the output characteristics are improved. Furthermore, since the n⁻ type GaAs layer 21 is exposed at the surface of the active layer on the opposite sides of the gate electrode 8, like the GaAs FET proposed in Japanese Published Patent Application No. Hei. 4-49626, unwanted expansion of the surface depletion layer due to electrons trapped by the surface states in the active layer at the opposite sides of the gate electrode is suppressed during RF operation, whereby degradation in the output characteristics during RF operation is reduced.

Embodiment 2.

FIGS. 2(a)–2(f) are sectional views illustrating process steps in a method of fabricating an FET in accordance with a second embodiment of the present invention. In these figures, the same reference numerals as in FIGS. 1(a)–1(e) designate the same or corresponding parts. Reference numerals 21a and 21b designate n⁻ type GaAs layers, and numeral 23 designates an n type AlGaAs layer. Reference numeral 300 designates an FET.

Figure 2:
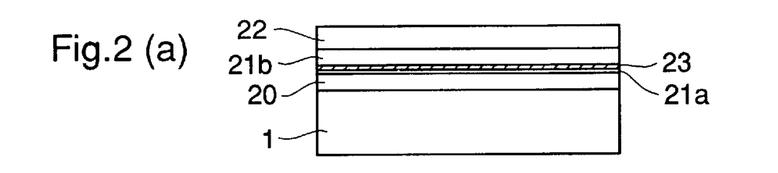
FIGS. 2(a)–2(f) are sectional views illustrating process steps in a method of fabricating an FET in accordance with a second embodiment of the present invention.

Initially, as illustrated in FIG. 2(a), there are successively grown on a semi-insulating GaAs substrate 1 an n type GaAs layer 20 having a dopant concentration of $6 \times 10^{17}$ cm⁻³ and a thickness of 500 Å, an n⁻ type GaAs layer 21 having a dopant concentration of $5 \times 10^{16}$ cm⁻³ and a thickness of 500 Å, an n type AlGaAs layer 23 having a dopant concentration of $5 \times 10^{17}$ cm⁻³ and a thickness of 50 Å, an n⁻ type GaAs layer 21b having a dopant concentration of $5 \times 10^{16}$ cm⁻³ and having a thickness of 2000 Å, and an n⁺ type GaAs layer 22 having a dopant concentration of $2 \times 10^{18}$ cm⁻³ and a thickness of 1000 Å. Preferably, these layers are grown by MBE.

In the step of FIG. 2(b), an SiO₂ film 3 about 3000 Å thick is deposited on the n⁺ type GaAs layer 22 by plasma CVD and patterned in the same manner as described in the prior art method to form an opening 3a.

In the step of FIG. 2(c), using the SiO₂ film 3 as a mask, a portion of the n⁺ type GaAs layer 22 exposed in the opening 3a of the SiO₂ film 3 is selectively removed by anisotropic dry etching. Subsequently, by anisotropic dry etching, the n⁻ GaAs layer 21b is partially etched away to a depth of 1000 Å from the upper surface, thereby forming a recess 2a.

Thereafter, side walls 5a are formed in the recess 2a in the same process steps described with respect to FIGS. 7(e) and 7(f) (FIG. 2(d)).

In the step of FIG. 2(e), using the side walls 5a as masks, a portion of the n⁻ type GaAs layer 21b beneath the recess 2a is selectively removed by reactive dry etching using a gas mixture of Cl₂ and SF₆. The n type AlGaAs layer 23 serves as an etch stopping layer. As a result of the etching, the n type AlGaAs layer 23 is exposed at the bottom of the recess 2a where a gate electrode is to be disposed.

Thereafter, a gate electrode 8 is formed in the recess 2a in the same process as described with respect to FIGS. 7(g) and 7(h), and source and drain electrodes 9a and 9b are formed on the n⁺ type GaAs layer 22, completing the FET 300 as shown in FIG. 2(f).

In this FET 300, a channel is produced by the n type GaAs layer 20, the n⁻ type GaAs layer 21a, and the n type AlGaAs layer 23, and a greater part of channel current flows in the n type GaAs layer 20. The channel current is determined by the dopant concentration of the n type GaAs layer 20.

In the fabrication method of an FET according to the second embodiment of the invention, after the side walls 5a are formed in the recess 2a, the n⁻ type GaAs layer 21b exposed at the bottom of the recess 2a is selectively etched away using the side walls 5a as masks and the n type AlGaAs layer 23 as an etch stopping layer, and the gate electrode 8 is formed on the surface of the n type AlGaAs layer 23 exposed by the etching. Therefore, the thickness of a portion of the active layer beneath the gate electrode 8 in which a channel is produced is determined by the total of the thicknesses of the n type AlGaAs layer 23, the n⁻ type GaAs layer 21a, and the n type GaAs layer 20. Therefore, FETs with uniform operating characteristics are fabricated with high reproducibility and improved production yield compared to the prior art method.

In the FET 300 fabricated by the method according to this second embodiment, since the channel current depends on the n type GaAs layer 20, a high transductance is maintained during RF operation, so that the gain is not lowered. Further, since the n⁻ type GaAs layer 21b is exposed at the surface of the active layer on the opposite sides of the gate electrode 8 and a lower end of the gate electrode 8 is buried in the n⁻ type GaAs layer 21b, the expansion of the surface depletion layer during the RF operation is further suppressed compared to the FET 200 of the first embodiment, whereby degradation in the output characteristics during RF operation is further reduced. Furthermore, since the n⁻ GaAs layer 21b is present at a part of the interface between the active layer and the gate electrode 8, the gate breakdown voltage is increased although the increase is not so much as the FET 200 according to the first embodiment.

Embodiment 3.

FIGS. 3(a)–3(f) are section al views illustrating process steps in a method of fabricating an FET in accordance with a third embodiment of the present invention. In the figures, the same reference numerals as in FIGS. 2(a)–2(f) designate the same or corresponding parts. Reference numeral 2b designates a recess, numeral 5b designates side walls, numeral 24 designates an n type AlGaAs layer, and numeral 400 designates an FET.

Figure 3:
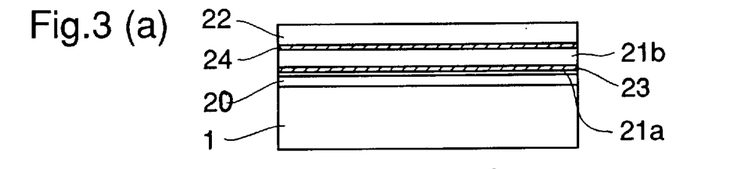
FIGS. 3(a)–3(f) are sectional views illustrating process steps in a method of fabricating an FET in accordance with a third embodiment of the present invention.

Initially, as illustrated in FIG. 3(a), there are successively grown on a semi-insulating GaAs substrate 1 an n type GaAs layer 20 having a dopant concentration of $6 \times 10^{17}$ cm⁻³ and a thickness of 500 Å, an n⁻ type GaAs layer 21a having a dopant concentration of $5 \times 10^{16}$ cm⁻³ and a thickness of 500 Å, an n type AlGaAs layer 23 having a dopant concentration of $5 \times 10^{17}$ cm⁻³ and a thickness of 50 Å, an n⁻ type GaAs layer 21b having a dopant concentration of $5 \times 10^{16}$ cm⁻³ and a thickness of 1000 Å, an n type AlGaAs layer 24 having a dopant concentration of $5 \times 10^{17}$ cm⁻³ and a thickness of 150 Å, and an n⁺ type GaAs layer 22 having a dopant concentration of $2 \times 10^{18}$ cm⁻³ and a thickness of 1000 Å. Layers 21a and 21b have the same composition and may be considered first and second parts of the same layer 21, although that reference number does not appear in the drawings. Likewise, the composition, but not the dopant concentration, of layer 22 is the same as that of layers 21a and 21b. Thus, layer 22 might be considered a third part of a GaAs layer including layers 21a and 21b. In addition, some or all of layers 21a, 23, 21b, 24, and 22 together constitute an active layer structure.

In the step of FIG. 3(b), an SiO$_2$ film 3 about 3000 Å thick is deposited on the n type GaAs layer 22 by plasma CVD and patterned in the same manner as described in the prior art method to form an opening 3a.

In the step of FIG. 3(c), using the SiO$_2$ film 3 with the opening 3a as a mask, the n$^+$ type GaAs layer 22 exposed in the opening 3a is subjected to selective wet or dry etching. The n type AlGaAs layer 24 serves as an etch stopping layer. In the etching process, a portion of the n$^+$ type GaAs layer 22 directly beneath the opening 3a of the SiO$_2$ film 3 is etched away and, furthermore, portions of the GaAs layer 22 under the SiO$_2$ film 3 are also etched by about 2000 Å at each side in the transverse direction, whereby a recess 2b about 4000 Å wider than the width of the opening 3a is produced. Although in this second embodiment the width of the recess 2b at the bottom is about 4000 Å wider than the width of the opening 3a, the width of the recess 2b can be varied by controlling the etching time.

In the step of FIG. 3(d), side walls 5b are formed in the recess 2b in the same process as described with respect to FIGS. 7(e) and 7(f). The side walls 5b fill the space of the recess 2b beneath the SiO$_2$ film 3.

In the step of FIG. 3(e), the n type AlGaAs layer 24 is selectively wet-etched with an aqueous solution of tartaric acid and hydrogen peroxide using the side walls as masks, and the n$^-$ type GaAs layer 21b is selectively etched by reactive dry etching with a gas mixture of Cl$_2$ and SF$_6$ using the n type AlGaAs layer 23 as an etch stopping layer. As a result of the etching, the n type AlGaAs layer 23 is exposed at the bottom of the recess 2b where a gate electrode is to be disposed.

Thereafter, a gate electrode 8 is produced in the same process as described with respect to FIGS. 7(g) and 7(h), followed by formation of source and drain electrodes 9a and 9b on the n$^+$ type GaAs layer 22, thereby completing the FET 400 shown in FIG. 3(f).

In the FET 400, a channel is produced by the n type GaAs layer 20, the n$^-$ type GaAs layer 21a, and the n type AlGaAs layer 23, and a greater part of the channel current flows in the n type GaAs layer 20. Therefore, the channel current is determined by the dopant concentration of the n type GaAs layer 20.

In the above-described fabrication method of an FET according to the third embodiment of the invention, by controlling the time required for the recess etching, the recess 2b having a bottom width larger than the width of the opening 3a of the SiO$_2$ film 3 that is used as an etching mask is produced. In addition, the side walls 5b fill the space of the recess 2b beneath the SiO$_2$ film 3. In the prior art method described with respect to FIGS. 7(a)–7(i), in order to increase the gate edge to recess edge distance for a high gate breakdown voltage, not only the width of the recess 2a, but also the width of the side wall 5a must be increased by increasing the thickness of the SiO$_2$ film 5. However, the increase in the thickness of the SiO$_2$ film 5 causes an increase in the time required for the fabrication and variations in the width of the side wall 5a. On the other hand, in the method according to this third embodiment of the invention, the width of the side wall 5b is increased not by increasing the thickness of the SiO$_2$ film 5 but by increasing the width of the recess 2b. Therefore, the above-described problems in the prior art method are solved. Consequently, when the gate edge to recess edge distance is increased to increase the gate breakdown voltage, variation in the gate length is reduced and production yield is increased compared to the prior art method.

Furthermore, in the FET 400 fabricated by the above-described method, the active layer at the opposite sides of the gate electrode 8 is the n$^-$ GaAs layer 21b, except the surface of the active layer, and a lower end of the gate electrode 8 is buried in the n$^-$ type GaAs layer 21b. This structure of the FET 400 is substantially identical to the structure of the FET 300 of the second embodiment, so that the same effects as described in the second embodiment are achieved.

Embodiment 4.

Figure 4:
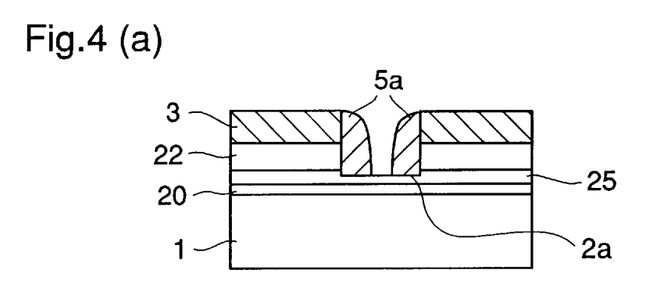
FIG. 4(a) is a sectional view illustrating a major process step in a method of fabricating an FET in accordance with a fourth embodiment of the present invention.
FIG. 4(b) is a sectional view illustrating an FET fabricated by the method.

FIG. 4(a) is a sectional view illustrating a process step in a method of fabricating an FET in accordance with a third embodiment of the present invention, and FIG. 4(b) is a sectional view illustrating an FET fabricated by the method. In the figures, the same reference numerals as in FIGS. 1(a)–1(e) designate the same or corresponding parts. Reference numeral 25 designates an n$^-$ AlGaAs layer, and numeral 500 designates an FET.

The fabrication process of an FET according to this fourth embodiment is fundamentally identical to the fabrication process according to the first embodiment except that an n$^-$ AlGaAs layer 25 is employed in place of the n$^-$ GaAs layer 21. FIG. 4(a) shows the structure after the side walls 5a are formed in the recess 2a.

In this fabrication method, the same function and effect as described in the first embodiment are achieved. In addition, since the low dopant concentration layer contacting the gate electrode 8 comprises AlGaAs that has an energy band gap wider than the energy band gap of GaAs, the gate breakdown voltage of the FET 500 is further increased compared to the FET 200 of the first embodiment.

Embodiment 5.

FIGS. 5(a)–5(d) are sectional views illustrating process steps in a method of fabricating an FET in accordance with a fifth embodiment of the present invention. In the figures, the same reference numerals as in FIGS. 1(a)–1(e) designate the same or corresponding parts. Reference numeral 26 designates an n type GaAs layer, numeral 26a designates a groove formed in the n type GaAs layer 26, numeral 27 designates an n$^-$ type GaAs layer, and numeral 600 designates an FET.

Initially, an n type GaAs layer 26 having a dopant concentration of $3\times10^{17}$ cm$^{-3}$ and a thickness of 3000 Å is grown on a semi-insulating GaAs substrate 1 by MBE. Thereafter, in the same process as described with respect to FIGS. 7(b)–7(d), according to the prior art, by anisotropic dry etching using the SiO$_2$ film 3 as a mask, a groove 26a having a prescribed depth is formed at the surface of the n type GaAs layer 26 (FIG. 5(a)).

Using the SiO$_2$ film 3 as a mask, an n$^-$ type GaAs layer 27 is selectively grown on the inner surface of the groove 26a by MOCVD. The n$^-$ type GaAs layer 27 has a dopant concentration of $5\times10^{16}$ cm$^{-3}$ and a thickness of 1000 Å. As a result, a recess 2c having an inner surface of the n$^-$ type GaAs layer 27 is produced (FIG. 5(b)).

Figure 5:
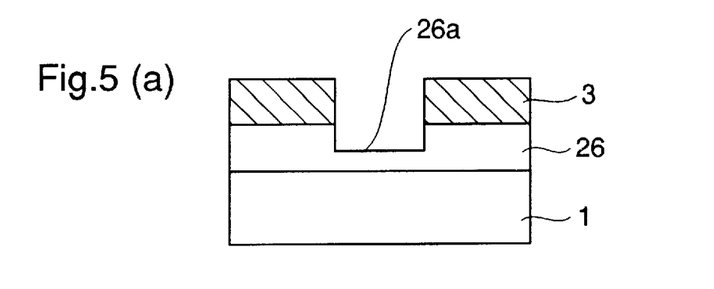
FIGS. 5(a)–5(d) are sectional views illustrating process steps in a method of fabricating an FET in accordance with a fifth embodiment of the present invention.

Thereafter, as illustrated in FIG. 5(c), side walls 5a are formed in the recess 2c in the same process as described with respect to FIGS. 7(e) and 7(f). To complete the FET 600 shown in FIG. 5(d), a gate electrode 8 and source and drain electrodes 9a and 9b are produced in the same process as described with respect to FIGS. 7(g)–7(i).

In the FET 600, a channel is produced by the n type GaAs layer 26 and the n⁻ type GaAs layer 27, and a greater part of channel current flows in the n type GaAs layer 26. Therefore, the channel current is determined by the dopant concentration of the n type GaAs layer 26.

In the fabrication method of an FET according to the fifth embodiment of the present invention, the n⁻ type GaAs layer 27 is selectively formed on the inner surface of the groove 26a in the n type GaAs layer 26 to form the recess 2c having an inner surface of the n⁻ type GaAs layer 27, and the gate electrode 8 is formed in the recess 2c. Therefore, as in the above-described method according to the first embodiment, even when the bottom of the recess 2c, i.e., a portion of the n⁻ type GaAs layer 27, is etched when the side walls 5a are formed and the thickness of that layer 27 varies at that portion, since a greater part of the channel current flows in the n type GaAs layer 26 of the completed FET 600, the channel current does not vary very much, resulting in an FET with less variation in the operating characteristics.

Furthermore, in the FET 600 fabricated by the method of this fifth embodiment, the gate electrode 8 is located in the recess 2c having an inner surface of the n⁻ type GaAs layer 27 that is selectively formed in the groove 26a of the n type GaAs layer 26, and the n⁻ GaAs layer 27 is present at the interface between the active layer and the gate electrode 8 and at part of the active layer on the opposite sides of the gate electrode. Therefore, like the FET 200 of the first embodiment, the gate breakdown voltage is increased, and reduction in the gain and degradation of the output characteristics during the RF operation are reduced. Furthermore, since the low dopant concentration layer is not present in a region of the active layer beneath the source and drain electrodes 9a and 9b, the gate breakdown voltage is increased with no increase in the gate-to-source resistance.

Embodiment 6.

A fabrication method of an FET according to this sixth embodiment of the present invention is fundamentally identical to the fabrication method according to the fifth embodiment except that an n⁻ type AlGaAs layer having the same dopant concentration and thickness as the n⁻ type GaAs layer 27 is selectively formed in the groove 26a in place of the n⁻ type GaAs layer 27.

The process steps of the fabrication method according to this sixth embodiment are identical to the process steps already described with respect to FIGS. 5(a)–5(d) and, therefore, do not require repeated description.

In the fabrication method of an FET according to the sixth embodiment, since the low dopant concentration layer contacting the gate electrode comprises AlGaAs having an energy band gap wider than the energy band gap of GaAs, the gate breakdown voltage is further increased compared to the FET 600 according to the fifth embodiment.

Embodiment 7.

FIGS. 6(a)–6(d) are sectional views illustrating process steps in a method of fabricating an FET in accordance with a seventh embodiment of the present invention. In the figures, the same reference numerals as in FIGS. 2(a)–2(f) designate the same or corresponding parts. Reference numerals 26b and 26c designates n type GaAs layers, numeral 26d designates a groove, and numeral 28 designates an n type AlGaAs layer.

Figure 6:
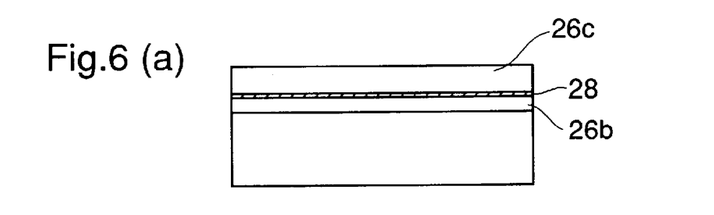
FIGS. 6(a)–6(d) are sectional views illustrating process steps in a method of fabricating an FET in accordance with a seventh embodiment of the present invention.

Initially, as illustrated in FIG. 6(a), there are successively grown on a semi-insulating GaAs substrate 1 an n type GaAs layer 26b having a dopant concentration of $3\times10^{17}$ cm⁻³ and a thickness of 1000 Å, an n type AlGaAs layer 28 having a dopant concentration of $5\times10^{17}$ cm⁻³ and a thickness of 100 Å, and an n type AlGaAs layer 26c having a dopant concentration of $3\times10^{17}$ cm⁻³ and a thickness of 2000 Å.

Thereafter, the n type GaAs layer 26c is subjected to anisotropic etching using an SiO₂ film 3 as a mask and the n type AlGaAs layer 28 as an etch stopping layer, in the same process as the prior art process described with respect to FIGS. 7(b)–7(d) to form a groove 26d having a bottom surface of the n type AlGaAs layer 28. Thereafter, using the SiO₂ film 3 as a mask, an n⁻ type GaAs layer 27 having a dopant concentration of $5\times10^{16}$ cm⁻³ and a thickness of 1000 Å is selectively grown in the groove 26d by MOCVD, whereby a recess 2c having an inner surface of the n⁻ type GaAs layer 27 is produced (FIG. 6(b)).

After formation of side walls 5a in the same process as described with respect to FIGS. 7(e) and 7(f), a portion of the n⁻ type GaAs layer 27 is selectively removed by reactive dry etching with a gas mixture of Cl₂ and SF₆ using the side walls 5a as masks and the n type AlGaAs layer 28 as an etch stopping layer, whereby the n type AlGaAs layer 28 is exposed at a part of the bottom of the recess 2c (FIG. 6(c)).

Finally, a gate electrode 8 and source and drain electrodes 9a and 9b are produced in the same process as described with respect to FIGS. 7(g)–7(i) to complete the FET 700 shown in FIG. 6(d).

In the FET 700, a channel is produced by the n type AlGaAs layer 28 and the n type GaAs layer 26b, and a greater part the channel current flows in the n type GaAs layer 26b, so that the channel current is determined by the dopant concentration of the n type GaAs layer 26b.

In the fabrication method of an FET according to this sixth embodiment of the invention, the thickness of a portion of the active layer beneath the gate electrode 8 in which the channel is produced is the total of the thicknesses of the n type AlGaAs layer 26 and the n type GaAs layer 26b. Therefore, as in the above-described second embodiment, an FET with less variation in operating characteristics is fabricated with high reproducibility.

In the FET 700 fabricated by the method of this seventh embodiment, the n⁻ GaAs layer 27 is present at the surface of the active layer on the opposite sides of the gate electrode 8, and an end of the gate electrode 8 is embedded in the n⁻ type GaAs layer 27. Therefore, in the fabricated FET 700, the gate breakdown voltage is increased, and reduction in the gain and degradation of the output characteristics during RF operation are reduced. In addition, since the low dopant concentration layer is not present in a region of the active layer beneath the source and drain electrodes 9a and 9b, the gate breakdown voltage is increased with no increase in the gate-to-source resistance.

Although in the above-described first, second, and fourth embodiments, anisotropic etching is employed when the recess is formed in the active layer, the recess may be formed by isotropic etching. Also in this case, the same effects as described above are achieved.

While in the above-described fifth and sixth embodiments anisotropic etching is employed when the groove is formed in the active layer, the groove may be formed by isotropic etching. Also in this case, the same effects as described above are achieved.

What is claimed is:

1. A method of fabricating a field effect transistor including:
   forming an active layer structure comprising a first semiconductor layer having a first composition and first and second parts, a second semiconductor layer having a second composition and sandwiched between the first and second parts of said first semiconductor layer, and a third semiconductor layer having the second composition and disposed on the second part of said first semiconductor layer;

forming an insulating film on said active layer structure and removing a prescribed portion of said insulating film to form an opening exposing part of said active layer structure;

forming a recess by selectively etching said active layer structure using said insulating film as a mask and said third semiconductor layer as an etch stopping layer so that said third semiconductor layer is exposed at the bottom of the recess and so that the recess extends beneath said insulating film;

forming side walls in the recess; and using said side walls as masks, forming a gate electrode in the recess.

2. The method of claim 1 wherein the first composition is GaAs and said the second composition is AlGaAs.

3. A method of fabricating a field effect transistor including:

forming an active layer structure comprising a first semiconductor layer having a first composition and first, second, and third parts, a second semiconductor layer having a second composition and sandwiched between the first and second parts of said first semiconductor layer, and a third semiconductor layer having the second composition and sandwiched between the second and third parts of said first semiconductor layer, wherein the second part of said first semiconductor layer has a lower dopant concentration than said second and third semiconductor layers;

forming an insulating film on said active layer structure and removing a portion of said insulating film to form an opening exposing part of said active layer structure;

forming a recess by selectively etching said active layer structure using said insulating film as a mask and said third semiconductor layer as an etch stopping layer so that said third semiconductor layer is exposed at the bottom of the recess and so that the recess extends beneath said insulating film;

forming side walls in the opening in said insulating film and in the recess;

using said insulating film and said side walls as masks, selectively anisotropically etching said third semiconductor layer and the second part of said first semiconductor layer, using said second semiconductor layer as an etch stopping layer, thereby exposing said second semiconductor layer at a part of the bottom of the recess; and using said side walls as masks, forming a gate electrode in the recess, contacting said second semiconductor layer.

4. The method of claim 3 wherein the first composition is GaAs and the second composition is AlGaAs.

5. The method of claim 3 including:

after forming said gate electrode, removing said insulating mask and said side walls; and forming source and drain electrodes on remaining respective parts of the third part of said first semiconductor layer.

* * * * *